(12) United States Patent
Tan et al.

(10) Patent No.: US 8,987,786 B1
(45) Date of Patent: Mar. 24, 2015

(54) STATE RETENTION POWER GATED CELL

(71) Applicants: Miaolin Tan, Suzhou (CN); Zhihong Cheng, Suzhou (CN); Juan Fu, Suzhou (CN); Peidong Wang, Suzhou (CN); Yali Wang, Suzhou (CN)

(72) Inventors: Miaolin Tan, Suzhou (CN); Zhihong Cheng, Suzhou (CN); Juan Fu, Suzhou (CN); Peidong Wang, Suzhou (CN); Yali Wang, Suzhou (CN)

(73) Assignee: Freescale Semiconductor, Inc, Austin, TX (US)

( * ) Notice: Subject to any disclaimer, the term of this patent is extended or adjusted under 35 U.S.C. 154(b) by 0 days.

(21) Appl. No.: 14/277,804

(22) Filed: May 15, 2014

(51) Int. Cl.
| | | |
|---|---|---|
| *H01L 27/00* | (2006.01) | |
| *H03K 3/012* | (2006.01) | |
| *H03K 19/00* | (2006.01) | |
| *H03K 3/356* | (2006.01) | |
| *H01L 27/02* | (2006.01) | |
| *G06F 17/50* | (2006.01) | |

(52) U.S. Cl.
CPC ............ *H03K 3/012* (2013.01); *H03K 19/0008* (2013.01); *H03K 3/356* (2013.01); *H01L 27/0233* (2013.01); *H01L 27/0207* (2013.01); *G06F 17/50* (2013.01)
USPC ........................................................ 257/207

(58) Field of Classification Search
CPC ............ H01L 21/8226; H01L 21/8228; H01L 21/8229; H01L 27/0207; H01L 27/0233; H01L 27/0244; H01L 27/1025; H01L 23/50; H01L 23/52; H01L 23/522; G06F 17/50; H03K 3/012; H03K 17/16; H03K 19/0008

USPC .................... 257/207, 574, 368, 499; 716/10; 365/232; 327/332
See application file for complete search history.

(56) References Cited

U.S. PATENT DOCUMENTS

| | | | |
|---|---|---|---|
| 4,857,987 A * | 8/1989 | Ogura et al. .................. 257/576 |
| 6,903,389 B1 | 6/2005 | Tai | |
| 7,129,562 B1 | 10/2006 | Gheewala | |
| 7,158,404 B2 | 1/2007 | Lai | |
| 7,164,301 B2 | 1/2007 | Chun | |
| 7,181,188 B2 | 2/2007 | Vu | |
| 7,365,596 B2 | 4/2008 | Padhye | |
| 7,839,207 B2 | 11/2010 | Sofer | |
| 8,063,415 B2 * | 11/2011 | Tsuda ........................... 257/207 |
| 8,363,504 B2 | 1/2013 | Priel | |
| 2007/0033548 A1 * | 2/2007 | Tatsumi ............................ 716/1 |
| 2007/0046323 A1 * | 3/2007 | Kuang et al. ...................... 326/26 |
| 2008/0169487 A1 * | 7/2008 | Shimbo et al. ................. 257/207 |
| 2010/0044755 A1 * | 2/2010 | Tsuda et al. ................... 257/206 |
| 2012/0286331 A1 | 11/2012 | Aton | |
| 2013/0076421 A1 | 3/2013 | Priel | |
| 2013/0132756 A1 | 5/2013 | Priel | |

* cited by examiner

*Primary Examiner* — Nathan Ha
(74) *Attorney, Agent, or Firm* — Charles Bergere

(57) ABSTRACT

A state retention power gated cell includes a logic cell arranged in two or more rows. The logic cell has an active layer including at least a first well and a second well disposed in first and second rows, respectively. In a normal operation mode, the first well is powered with a first bias voltage, the second well is powered with a second bias voltage, the first power supply line is powered with VDDC, and the second power supply line is powered with VDD. In a standby mode, the first well preferably is powered down, the second well is powered with the second bias voltage, the first power supply line is powered with VDDC, and the second power supply line is powered down.

12 Claims, 8 Drawing Sheets

STATE RETENTION POWER GATED CELL

BACKGROUND OF THE INVENTION

The present invention relates to an integrated circuit including a logic cell and, more particularly, to a state retention power gated cell.

In current integrated circuits (IC), low power consumption is an important concern, particularly for mobile devices where power storage is limited. In this regard, a number of electronic devices have a normal operation mode in which the ICs in the device are powered so that they can operate normally, for example, at high speed (frequency), and a standby (or sleep) state in which a part of (or, even most of) the ICs are powered down. However, even in the power down or sleep state, the operation state (associated information) of some of the circuits must be retained.

One way to retain state is to use a logic cell, for example, a State Retention Power Gated (SRPG) cell, to retain necessary information when in the standby or sleep mode. An SRPG cell has two power supplies. A primary power supply (VDD) is used to power the logic cell in the operational mode and a secondary power supply (VDDC) is used to power part of the circuitry that is not shut down in the standby or sleep mode. SRPG cells are well known in the art, and a typical SRPG cell may be a flip-flop, for example, such as a cascaded RS flip-flop.

As regards the cell layout, the cell can be arranged in a single row or multiple rows, that is, the circuits in the SRPG cell can be arranged into a single row or multiple rows. SRPG cells with one row arrangement are often termed as single-row-height while SRPG cells with a multiple row arrangement are termed multi-row-height SRPG cells.

In current SRPG cells, the second power supply VDDC consumes a lot of routing resources, which results in high routing congestion and low utilization in Sea of Gates (SOG). The low utilization of the SOG can cause a need for an increased die size. Further, some of the circuitry, for example, MOS transistors, of the SRPG cell is continuously powered in the standby mode, resulting in relatively high well-leakage.

BRIEF DESCRIPTION OF DRAWINGS

The accompanying drawings, which are incorporated in and constitute a part of the specification, illustrate embodiments of the invention and, together with the description, serve to explain the principles of the invention. By reading the following detailed description with reference to the accompanying drawings, the present invention can be better understood. In the drawings.

Figure 1A:
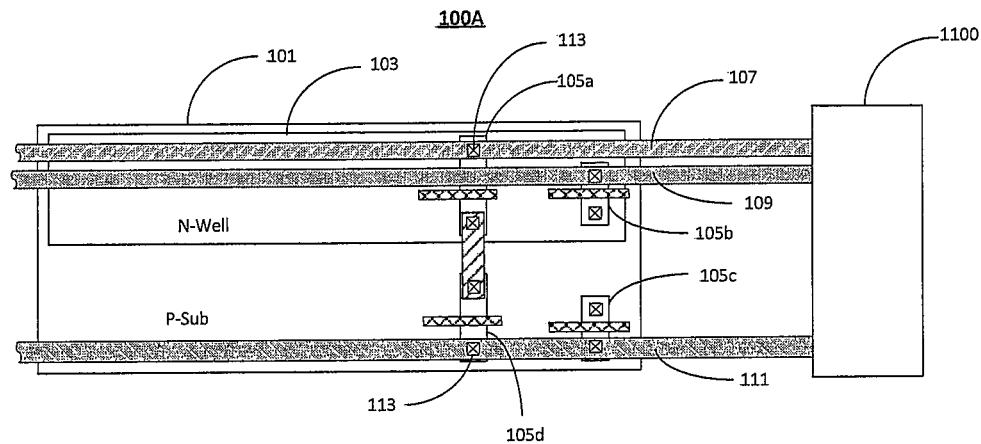
FIG. 1A is a simplified layout plan view of a conventional SRPG cell supplied with two different power supplies VDD and VDDC.

It should be understood that the drawings are merely illustrative and not intended to limit the scope of the present invention. In the drawings, components have not been drawn strictly to scale or shown according to their actual shapes. Some components (e.g., layers or parts) may be enlarged relative to others, to more clearly explain the principles of the present invention. It should also be understand that the drawings are simplified illustrations of the layout plan views so as not to obscure the gist of the present invention.

DETAILED DESCRIPTION

Hereinafter, the embodiments of the present invention will be described in conjunction with the accompanying drawings.

As used herein, the term "semiconductor device" (may be simplified as "device") refers to any devices that can operate by partially or fully using semiconductor characteristics, such as a MOS transistor. As used herein, the term "coupling" and its variations are not intended to be limited to directly coupling or mechanical coupling.

The present invention provides an SRPG cell that is laid out into a multi-row height (x2 height for instance or xN). The multi-row height layout allows for efficient power routing such that it saves on metal routing resources. Saving routing resources allows a more efficient and full SOG utilization for an SOC using the SRPG cell. The SPRG cell also has fewer N-wells tied to VDDC and less N-well leakage.

In one embodiment of the present invention, a logic cell arranged in two or more rows includes an active layer having a first well disposed in a first row and a second well disposed in a second, different row; and a plurality of semiconductor devices formed in and on the active layer and arranged in the two or more rows. A first semiconductor device is formed partly in the first well and a second semiconductor device is formed partly in the second well. A first power supply line is provided only for the first row. A current terminal of the first semiconductor device is coupled to the first power supply line. A second power supply line is provided for the second row. A current terminal of the second semiconductor device is coupled to the second power supply line. The first well is powered with a first bias voltage in a first operation mode and in a second, different operation mode, and the second well is powered with a second, different bias voltage in the first operation mode. The first power supply line is powered with a first power voltage in both of the first and second operation modes. The second power supply line is powered with a second power voltage that is different from the first power voltage in the first operation mode, and is powered down in the second operation mode.

According to another embodiment of the present disclosure, a layout design method for providing a logic cell arranged in two or more rows is provided. The method includes the steps of setting a first well disposed in a first row and a second well disposed in a different second row, each of the first and second wells having a first conductivity type in an active layer. The method includes setting a plurality of semiconductor devices in and on the active layer and arranged in the two or more rows, wherein the plurality of semiconductor devices include at least one first semiconductor device formed partly in the first well and at least one second semiconductor device formed partly in the second well; setting a first power supply line only for the first row, where a current terminal of the first semiconductor device is coupled to the first power supply line; and setting a second power supply line for at least the second row, where a current terminal of the second semiconductor device is coupled to the second power supply line for the second row. The first well is powered with a first bias voltage in a first operation mode, and the second well is powered with a second, different bias voltage in the first operation mode. The first power supply line is powered with a first power voltage (VDDC) in both the first and second operation modes. The second power supply line is powered with a second power voltage (VDD) that is different from the first power voltage (VDDC) in the first operation mode, and is powered down in the second operation mode.

Other advantages, objects, and aspects of the present invention will become apparent from the following detailed description in conjunction with the drawings.

Referring now to FIG. 1A, a simplified layout plan view of a conventional SRPG cell 100A of an integrated circuit is shown. The SRPG cell 100A is supplied with two different power supplies VDD and VDDC for operating in two different modes, i.e., normal operation mode and standby mode.

The SRPG cell 100A is arranged in a single row, and includes a row or active layer 101. The active layer 101 is a first conductivity type, e.g., a P-type active layer, formed from a P-type silicon substrate (denoted as P-Sub in FIG. 1) or on a substrate (for example, Semiconductor-On-Insulator (SOI) substrate). There is a well 103 of a second conductivity type (e.g., N-type) defined in the P-type active layer 101, as shown. A plurality of semiconductor devices 105a through 105d is formed in the active layer 101. The devices 105a-105d may be Metal-Oxide-Semiconductor (MOS) transistors. The devices 105a and 105b are at least partly formed in the N-type well 103, whereas the devices 105c and 105d are partly formed in the P-type substrate (P-Sub).

A first power supply line 109 is provided for the row and carries a first power supply voltage (VDDC). A second power supply line 107 is provided for the row for carrying a second power supply voltage VDD, which is different from VDDC, where VDD is greater than VDDC. A typical VDD is about 1.8V and VDDC about 1.2V. In addition, a supply line 111 is provided for each row, which is capable of carrying yet another, different voltage, such as VSS (GND), which corresponds to a fourth power supply voltage.

The devices 105a and 105b are P-type MOS transistors, and devices 105c and 105d are N-type MOS transistors. As is known in the art, a MOS transistor has four terminals, namely a control terminal (gate), two current terminals (source and drain), and a back-bias terminal, which may be the well or substrate and normally is connected to a bias voltage. A source terminal of the device 105a is coupled to the VDD line 107, and the drain of the device 105a is coupled to the drain terminal of the device 105d. The source terminal of the device 105d is coupled to the VSS line 111. The devices 105a and 105d constitute an inverter. In a standby mode, the device 105a is powered down so that it does not operate and thus the device 105d also does not operate. For example, powering down the device 105b is achieved by powering down the VDD line 109, for example, reducing the voltage of the VDD line 109 or typically, stopping the supplying of VDD power.

The source terminal of the device 105b is coupled to the VDDC line 109, and the drain terminal of the device 105b is coupled to another node. For example, device 105c is illustrated to show the last device connected to the VSS line 111 in a current path from the VDDC line 109, through the device 105b, other devices (not shown), and device 105c to the VSS line 111.

In a normal operation mode, the semiconductor devices 105a-105d are powered so that they operate normally. For example, the device 105b has one of its current terminals coupled to the VDDC line 109 and is powered with VDDC, and the device 105a has one of its current terminals coupled to the VDD line 107 and is powered with VDD. When the cell 100A transitions from the normal operation mode to the standby mode, only the device 105b is continuously powered with VDDC, while the power supply terminal of the device 105a (i.e., VDD) is powered down.

FIG. 1A shows a typical single well process for manufacturing devices, in which only wells with a same conductivity type are formed, that is, all the formed wells have the same conductivity type, for example, N-type wells (N-Wells). No P-type wells are formed in the single well process and thus, each of the P-type devices in the cell is formed in an N-Well in the active layer 101.

In such a case, the N-wells 103 may need to be powered with a bias voltage (Vbias1) even in the standby mode so that the device 105b can remain operating. In some cases, the gate of the device 105b may be selectively supplied with a control voltage so that the state just before the standby mode can be retained. Since unnecessary area of the N-Well, for example, the area corresponding to the device 105a that is actually powered down, is powered with the bias voltage, this can cause unnecessary leakage current, resulting in relatively large leakage.

The SRPG cell 100A may further include a control section 1100 for controlling the supply of the first and second bias voltages and the first and second power voltages to the cell 100A, and to set the cell in the first and second operation modes. The structure and operations of the control section 1100 are well known in the art.

Figure 1B:
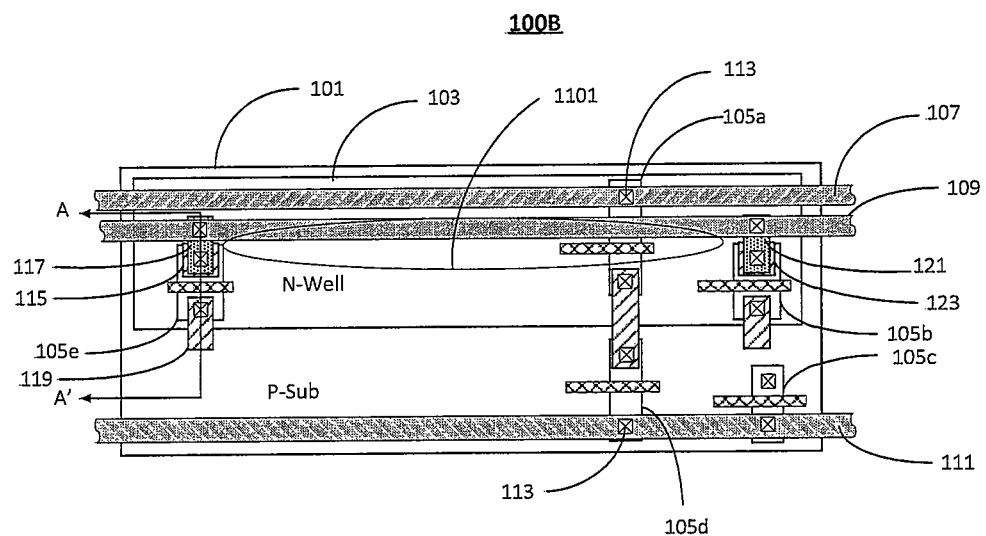
FIG. 1B is a simplified layout plan view of a conventional SRPG cell supplied with two different power supplies VDD and VDDC, which are formed with two different wiring layers.

FIG. 1B schematically illustrates a simplified layout plan view of another conventional logic cell 100B that is supplied with two different power supply voltages, VDD and VDDC. The layout of the logic cell 100B is similar to that of the logic cell 100A, except that the VDD line 107 and the VDDC line 109 are formed from two different wiring layers. Specifically, the VDD line 107 is formed in metal1 and the VDDC line 109 is formed in metal3.

Metal1 is the first metal wiring layer above and closest to the device (or, the active layer). The gate structure of a MOS transistor can be formed over the active layer, including gate insulating layer over an active surface of the active layer, a gate over the gate insulating layer, and spacers for the gate. Generally, metal1 is used for source/drain wiring. Metal1 can also be used as the VSS line 111.

In this example, metal3 is used for the VDDC line 109; metal3 is the third metal wiring layer from the active surface of the devices. In order to couple the power supply terminal of the devices 105b, 105e to the VDDC line 109, a part of the metal1 layer and a part of an intermediate wiring layer between metal1 and metal2, may need to be used because it may be difficult to form a reliable contact hole directly from metal3 to the drain/source of the device.

As shown in FIG. 1B, the structures of the devices 105b and 105e are similar to each other, and will be described in more detail with reference to FIG. 1C.

Figure 1C:
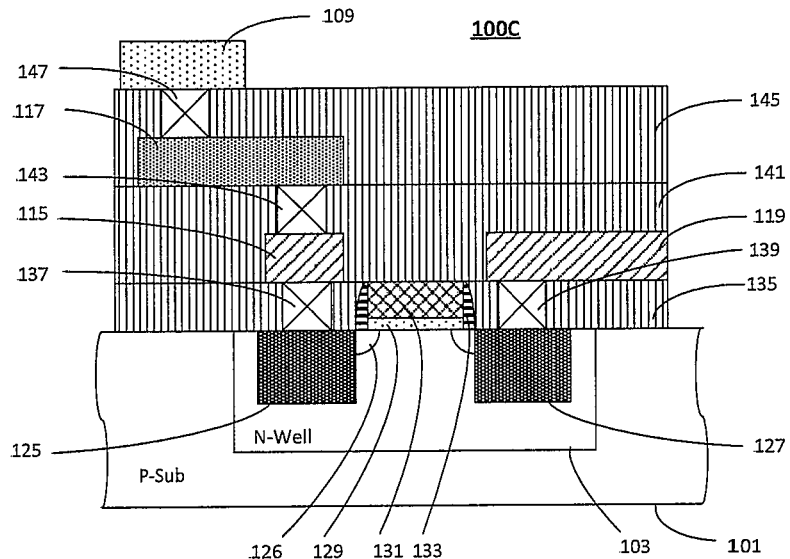
FIG. 1C schematically illustrates a section view along the line A-A' of the SRPG cell of FIG. 1B.

FIG. 1C schematically illustrates a cross-sectional view of logic device 100C, along the line A-A' of the logic cell 100B illustrated in FIG. 1B. As can be clearly seen from FIG. 1C, a N-Well 103 is formed in the active layer (P-Sub layer) by implanting N-type impurities into the P-type substrate so that the conductivity type of the intended areas is reversed. A gate structure including a gate insulating layer 129 over a surface of the N-Well, a gate (for example, a poly gate) 131 over the gate insulating layer 129 and spacers 133 at the sides of the gate 131 and the gate insulating layers 129 are formed. Then, a source 125 and a drain 127 of the device 105e are formed in the N-Well 103 by, for example, implantation. Optionally, Lightly Doped Drain (LDD) regions 126 can be formed to reduce the possibility of punch-through effects. Then, a first dielectric layer 135 is formed over the substrate 101 with contacts (also referred to as vias) 137 and 139 formed therein, which penetrate the first dielectric layer 135 and extend to the drain/source of the device 105e.

Then, a patterned first wiring layer (metal1) is formed over the substrate, which includes the wiring 119 (FIG. 1B), the VDD line 107 (FIG. 1B), the VSS line 111 (FIG. 1B), and a separate part 115 for coupling the source of the device 105e to the VDDC line 109. After that, a first interlayer dielectric layer 141 is formed to cover the metal1 layer and the first dielectric layer 135, and then a via 143 is formed in the first interlayer dielectric layer 141 and extends to the separate part 115 of the metal1 layer. Then, a patterned second wiring layer (i.e., metal2) is formed over the first interlayer dielectric layer 141, which includes the wiring 117 functioning as an interconnect. Thereafter, a second interlayer dielectric layer 145 is formed to cover the metal2 layer. A via 147 is formed in the second interlayer dielectric layer 145 and extends to the wiring 117 of the metal2 layer. Then, a patterned third wiring layer (metal3) is formed, which includes the VDDC line 109.

As shown in FIG. 1B, some devices 105b and 105e can be powered in the standby mode, and some devices 105d powered down (or not powered) in the standby mode. Since only a few of the devices (105b, 105e) are powered in the standby mode, which is less than 50% of all the P-type devices, normally less than 20% and even less than 10% of all the devices in some cases, the area between the two interconnects 117 and 121, as indicated by the ellipse 1101, is substantially blocked by the two interconnects 117 and 121 from being used for the routing of other metal2 wirings; this is referred to as a routing block, and thus, routing efficiency of the metal2 layer is decreased.

Figure 1D:
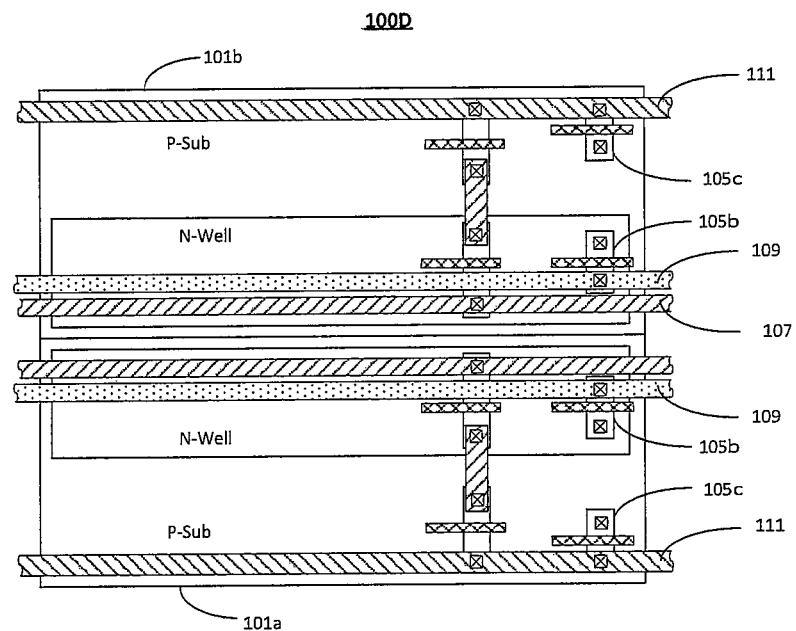
FIG. 1D schematically illustrates a simplified layout plan view of a conventional two-row-height SRPG cell supplied with two different power supplies VDD and VDDC.

FIG. 1D schematically illustrates a simplified layout plan view of a conventional two-row-height logic cell 100D that is supplied with two different power supplies VDD and VDDC. The logic cell 100D includes two rows 101a and 101b, where the arrangement of each of the rows 101a, 101b is similar to that of the row 101 illustrated in FIG. 1A. As shown, there is an N-Well for each row 101a, 101b, and P-type devices are formed in the N-Wells. Thus, even though the cell 100D has a two-row-height, since the layout of the rows 101a, 101b is similar to the layout shown in FIGS. 1B and 1C, the cell 100D has the same deficiencies as the cell 100B/100C.

Figure 2:
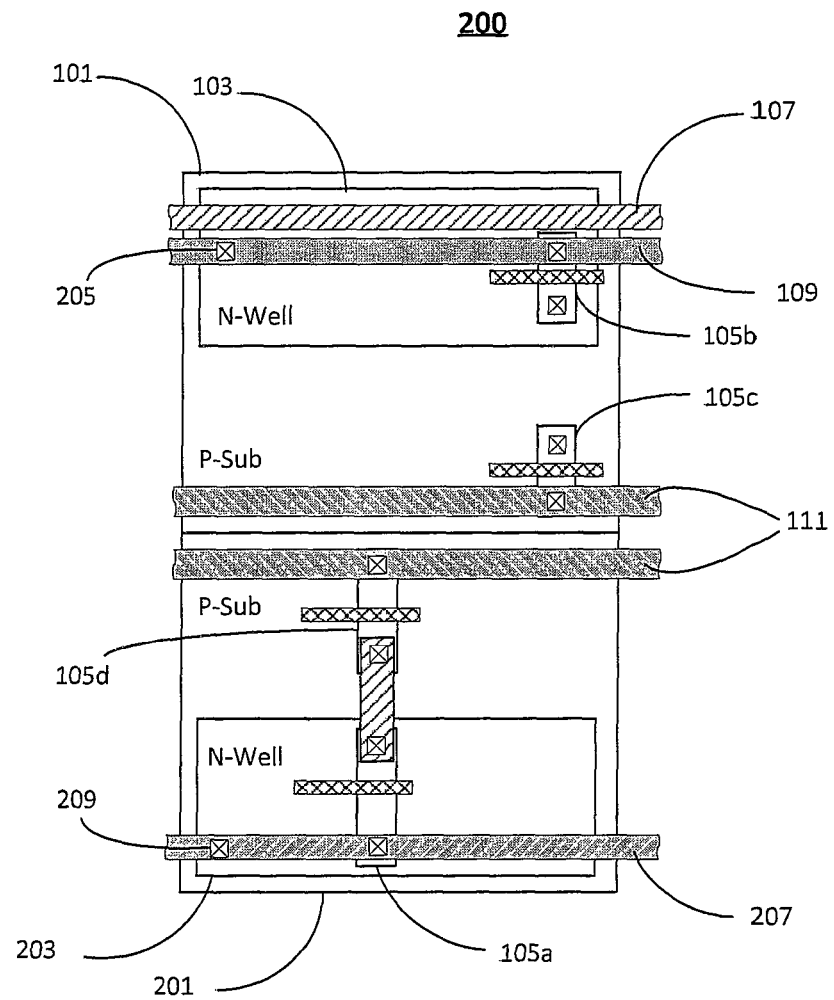
FIG. 2 is a simplified layout plan view of a two-row-height logic cell according to an embodiment of the present invention.

FIG. 2 schematically illustrates a simplified layout plan view of a two-row-height logic cell 200 according to an embodiment of the present invention. The logic cell 200 can be arranged in two or more rows, and in FIG. 2, it is shown as being arranged in two rows 101 and 201. It should be understood by those of skill in the art that the logic cell 200 can be properly included in an integrated circuit. For example, in some applications, the logic cell 200 can be applicable as a novel standard cell for an IC library.

As shown, the logic cell 200 includes an active layer, which includes wells having a first conductivity type (for example, N-type), two of which are shown, a first well 103 disposed in the first row 101 and a second well 203 disposed in the second row 201. The first well 103 and the second well 203 have the same conductivity type, which in this example is N-type. It should be noted that the boundaries of the rows 101, 201 are illustrative and descriptive, and are not limitations to the scope of the invention in any aspects.

The logic cell 200 further includes a plurality of semiconductor devices 105, 205 formed in and on the active layer (that is, at least partly formed in the active layer) and arranged in the two rows 101, 201. It should be noted that P-type devices can be formed in the N-Wells, and N-type devices can be formed in the P substrate. In FIG. 2, the plurality of semiconductor devices includes a first semiconductor device 105b formed partly in the first well 103 and a second semiconductor device 105a formed partly in the second well 203. In some preferred embodiments, all the P-type devices that are to be powered in the standby mode are formed in first well(s). In some other preferred embodiments, all the P-type devices that are to be powered down in the standby mode are formed in second well(s).

The logic cell 200 further includes a first power supply line 109 only for the first row 101, which is capable of carrying a first power voltage VDDC. That is, there is no such a first power supply line provided for the second row(s) which does not contain any devices to be powered in the standby mode. A source terminal of the first semiconductor device 105b is coupled to the first power supply line 109 (VDDC line 109).

The logic cell 200 further includes a second power supply line 207 for at least the second row 201, which is capable of carrying a second power voltage VDD. As shown, a VDD line 207 is provided for the second row 203. However, a VDD line 107 is also provided for the first row 101 in the case the VDD voltage is needed in the operation of the devices in the first row 101. A source terminal of the second semiconductor device 105a is coupled to the second power supply line 207 for the second row 203.

The source terminal of the first device 105b is powered with the VDDC voltage in both of the normal operation mode (i.e., the first operation mode) and the standby mode (i.e., the second operation mode). The source terminal of the second device 105a is powered with the VDD voltage in the normal operation mode, and is powered down in the standby mode. As mentioned above, the powering down of the devices 105 can be carried out by powering down of the VDD line 107 and VDDC line 109.

The first well 103 is powered with a first bias voltage (Vbias1, not shown) in both of the standby mode and the normal operation mode. The second well 107 is powered with a second bias voltage (Vbias2, not shown), which preferably is different from the first vias voltage. In some preferable examples, the second well(s) 203 are powered down in the standby mode to reduce power consumption. In some other preferred examples, the wells other than the first well(s) 103, including the second well(s) 203, are powered down in the standby mode to further reduce the power consumption. In the case of an SRPG cell, the first semiconductor device 105b is capable of retaining associated information thereof in the standby mode. And, because of the powering down of the second well 203, the area of the wells powered in the standby mode is significantly reduced, and thus the well leakage is reduced.

FIG. 2 also shows vias 205 and 209 coupled to the first and second wells 103, 203, respectively, which are representative of a first bias supply element for supplying the first bias voltage to the first well 103, and a second bias supply element for supplying the second bias voltages to the second well 203. It should be note that it is not intended to limit the bias supply elements to vias 205 and 209, instead, the first and second bias supply elements can be any suitable connection means as long as they can supply bias voltages to the wells 103, 203. For example, the first and second bias supply elements may include wiring lines in addition to the vias coupled to the wells in the case, for example, that the wells are required to be supplied with voltages different from the source voltage of the devices. In some other examples, the bias voltage(s) can be supplied from back-side electrodes of the substrate. Note also, for a P-type MOS device, the bias voltage supplied to the well thereof preferably is equal to or higher than the voltage supplied to the source thereof.

As shown in FIG. 2, a third supply line 111 is provided for each of the rows 101 and 201, for carrying a third voltage (VSS). In some preferred implementations, the third supply line (VSS line 111) is shared by two adjacent ones of the rows, for example, the rows 101 and 201 (see FIG. 3), so that the occupied area, and thus the area of the whole logic cell can be further reduced. As should be understood by those of skill in the art, the VDD line 107/207 and the VSS line 111 are formed near the top or bottom of the respective row, although it is shown in FIG. 2 that they are disposed in the respective rows.

The boundaries of the rows are for illustrative purposes for facilitating an understanding of the present invention, not for limitation purpose. Further, although the second N-Well 203 and the VDD line 207 are illustrated as near the bottom of the second row 201, it should be understood that there is no particular limitations on their positions as long as they conform to design rules. For example, in one embodiment, the second row 201 is turned upside down so that the N-Well 203 and the VDD line 207 are adjacent to the bottom of the first row 101.

Figure 3:
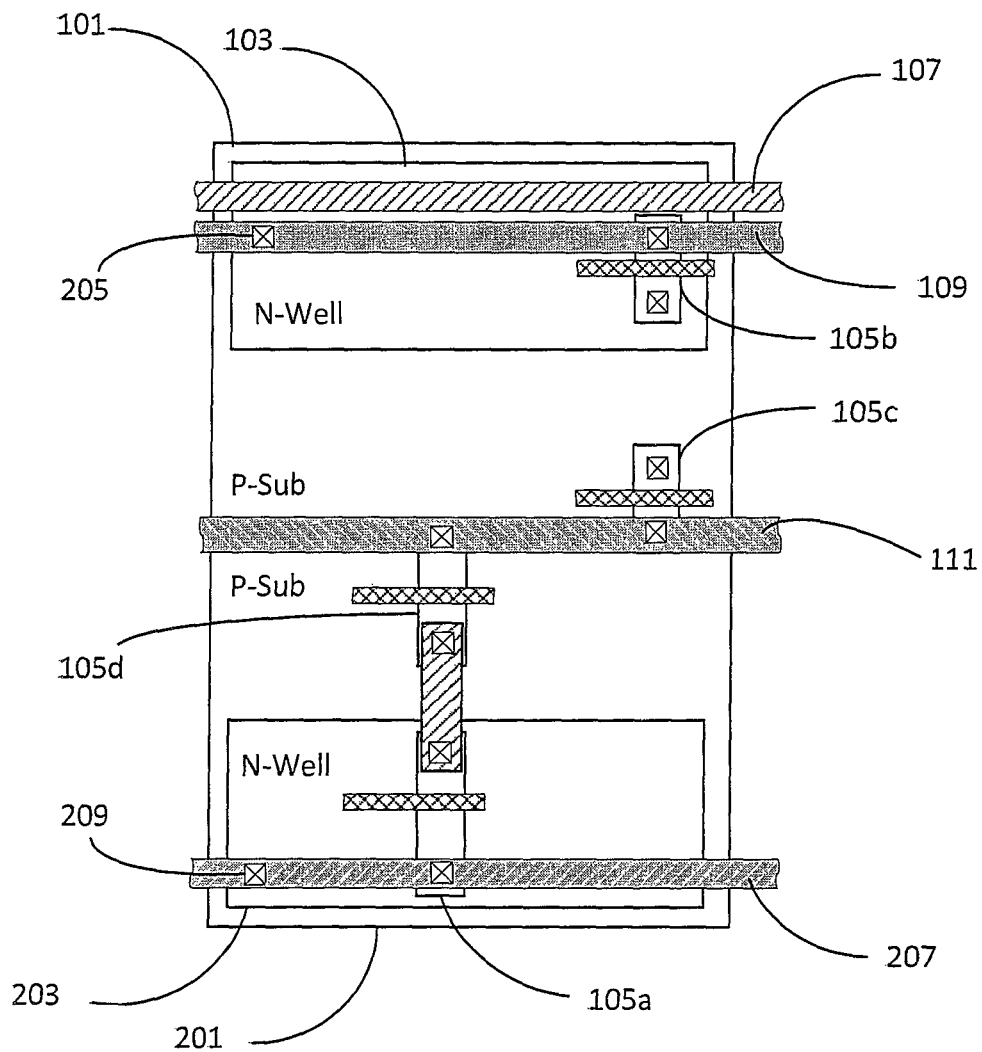
FIG. 3 is a simplified layout plan view of a two-row-height logic cell according to another embodiment of the present invention.

FIG. 3 schematically illustrates a simplified layout plan view of a two-row-height logic cell 300 according to a variation of the embodiment 200 shown in FIG. 2, in which the third supply line (VSS line 111) is shared by the first and second rows 101, 201 so that the occupied area, and thus the area of the logic cell is further reduced.

Figure 4:
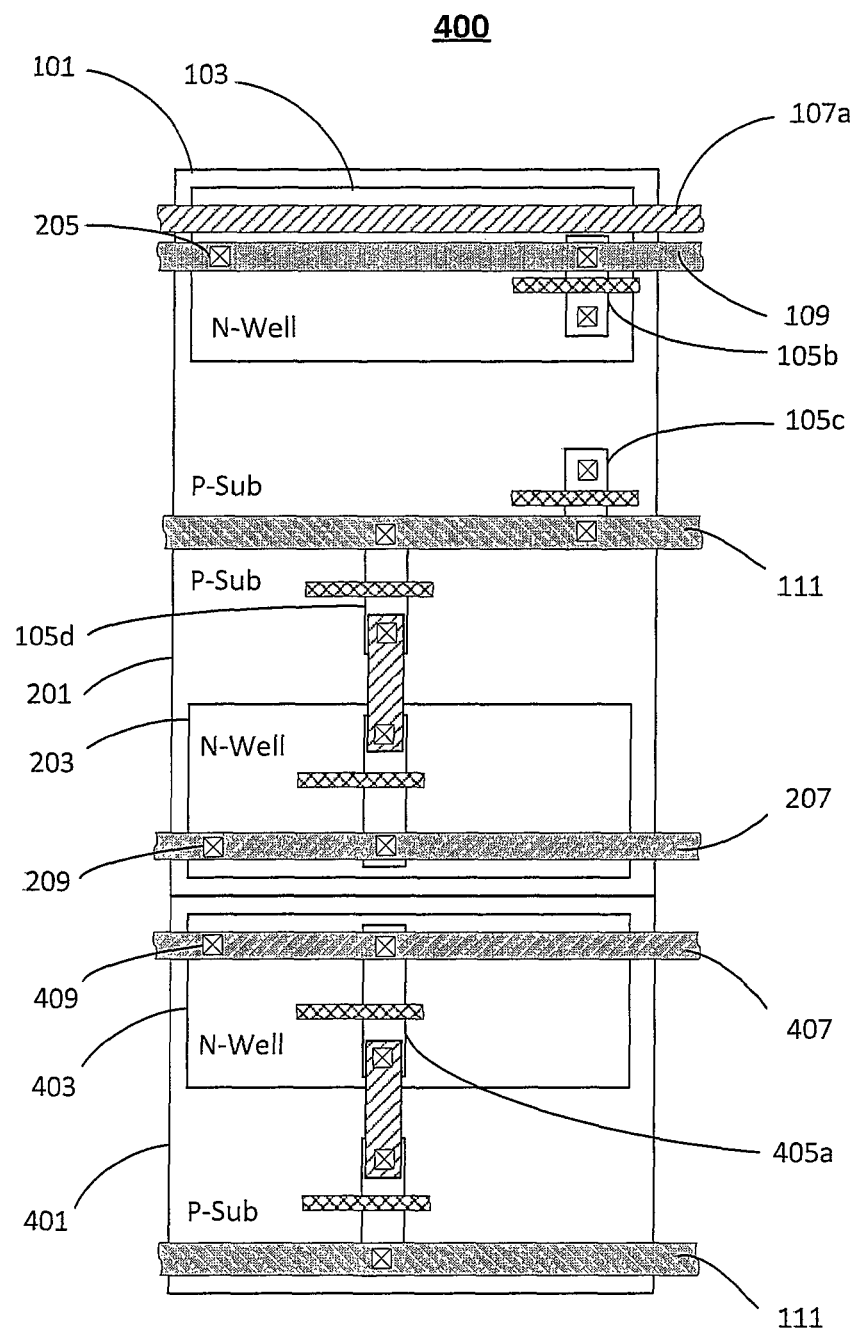
FIG. 4 is a simplified layout plan view of a three-row-height logic cell according to an embodiment of the present invention.

FIG. 4 schematically illustrates a simplified layout plan view of a three-row-height logic cell 400 for an integrated circuit according to an embodiment of the present invention. The logic cell 400 includes three rows 101, 201, and 401. The configuration of the third row 401 is similar to that of the second row 201. As compared with the configurations of the logic cells 200 and 300, the logic cell 400 further includes the third row 401, a third well 403 having P-type conductivity and disposed in the third row 401, an additional second power supply line 407 (VDD line) for the third row 401, and at least one third semiconductor device 405a, which is arranged in the third row 401, partly formed in the third well 403, and has a current terminal connected to the additional second power supply line 407 (VDD). The third well 403 may be powered with the third bias voltage (Vbias3, not shown) in the normal operation mode and powered down in the standby mode. The third bias voltage can be the second bias voltage or can be different from the second bias voltage. The current terminal of the third semiconductor device 405a is capable of being powered with a third power supply voltage in the normal operation mode and powered down in the standby mode. The third power supply voltage can be VDD or a voltage different from VDD and VDDC. Also, it should be noted that the voltage supply lines 407 and 207 can be merged into a single line if the third power supply voltage is VDD, and in such a case, the third power supply line 407 may be equivalent to an additional second power supply line that is supplied with the second power supply voltage, VDD.

A third bias supply structure 409, in this case a via, supplies the third bias voltage Vbias3 to the third well 403. The via 409 is similar to the vias 205 and 209.

Figure 5:
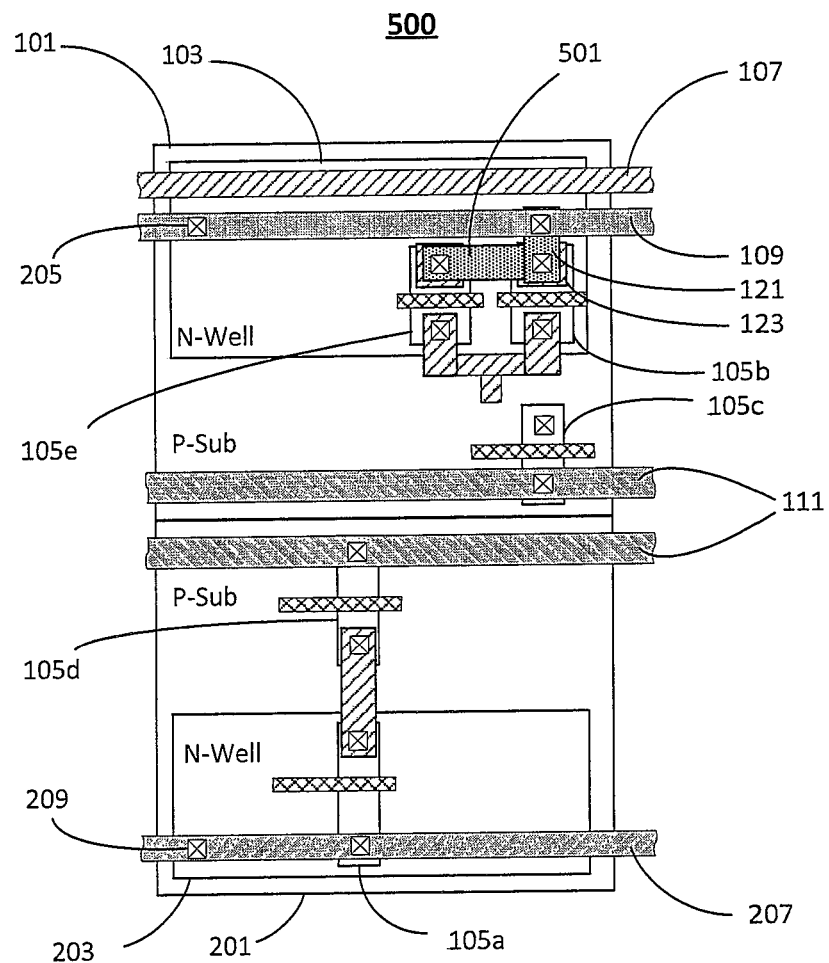
FIG. 5 is a simplified layout plan view of a logic cell according to another embodiment of the present invention.

FIG. 5 schematically illustrates a simplified layout plan view of a logic cell 500 of an integrated circuit according to another embodiment of the present invention. The configuration of the logic cell 500 is similar to the logic cell 200 illustrated in FIGS. 2 and 3, except that the VDD line 107 and VDDC line 109 are formed from different wiring layers, for example, metal1 and metal3, as illustrated in FIGS. 1B and 1C.

As can be seen from FIG. 5, because the second well 203 is added for the P-type devices, which are to be powered down, and the device 105a is moved from the well 103 illustrated in FIG. 1C to the well 203 of the second row 201 of FIG. 5, the connection of the source of the device 105e to the VDDC line 109 (metal3) is carried out with a traverse interconnect 501, and thus the metal2 routing block illustrated in FIG. 1C is avoided.

Figure 6:
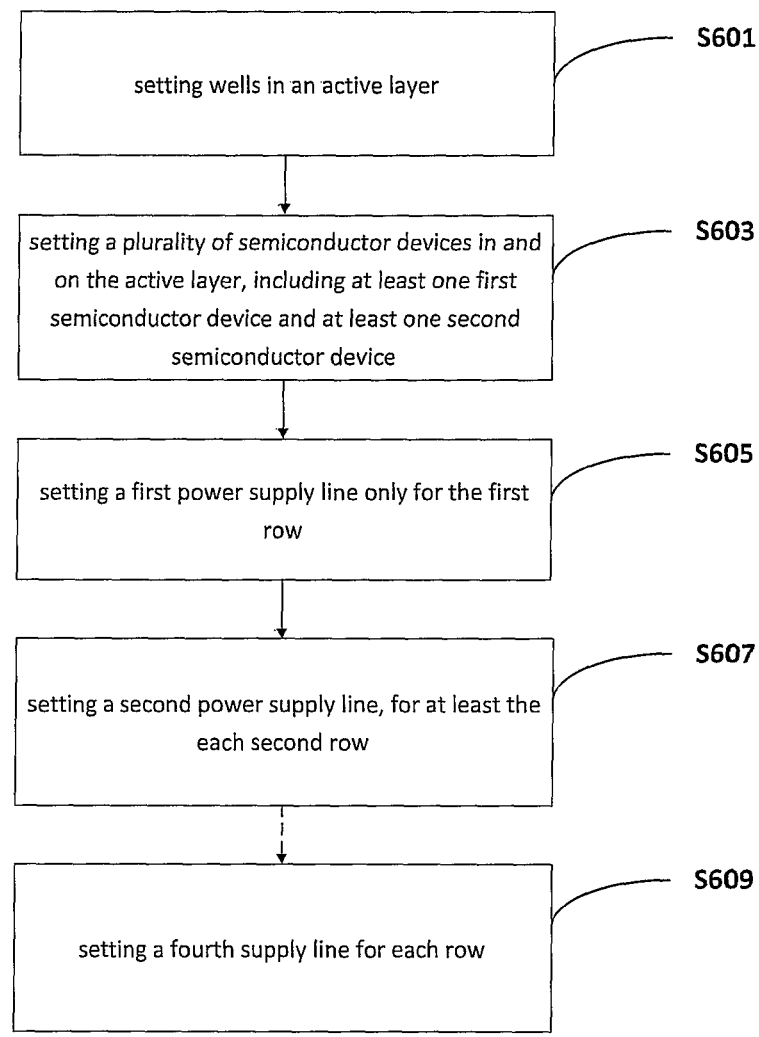
FIGS. 6-8 are a flow chart for a method of forming an SRPG cell in accordance with an embodiment of the present invention.
Figure 7:
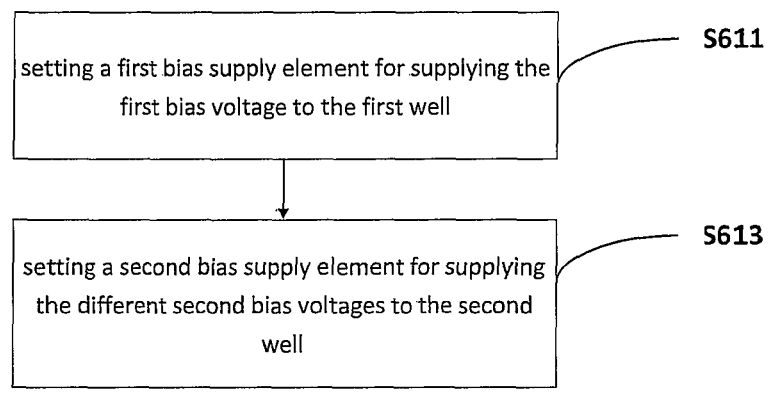
Figure 8:
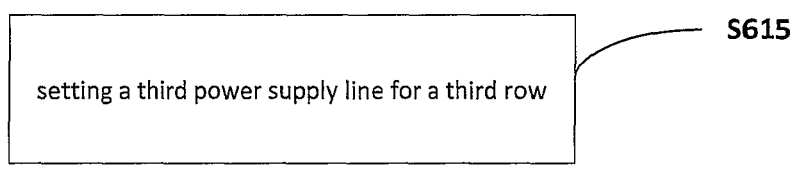

The present invention also provides a layout design method 600 for providing an integrated circuit including a logic cell arranged in two or more rows, as illustrated in FIGS. 6-8. The method 600 includes the steps of: setting S601 wells having a first conductivity type in an active layer, including a first well (103) disposed in a first row (101) and a second well (203) disposed in a different second row (201); forming S603 a plurality of semiconductor devices in and on the active layer and arranged in the two or more rows (101, 201), wherein the plurality of semiconductor devices include at least one first semiconductor device (105b) formed partly in the first well (103) and at least one second semiconductor device (105a) formed partly in the second well (203); setting S605 a first power supply line (VDDC line 109) only for the first row, a current terminal of the first semiconductor device being coupled to the first power supply line; and setting S607 a second power supply line (VDD line 207), for at least the second row, a current terminal of the second semiconductor device (105a) being coupled to the second power supply line for the second row. The first well is powered with a first bias voltage (Vbias1, not shown) in a first operation mode and in a second, different operation mode, and the second well is powered with a different second bias voltage (Vbias2, not shown) in the first operation mode. The first power supply line (107) is powered with a first power voltage (VDDC) in both of the first and second operation modes. The second power supply line (109) is powered with a second power voltage (VDD), which is different from the first power voltage in the first operation mode, and powered down in the second operation mode.

In one embodiment, the first operation mode is a normal operation mode, and the second operation mode is a standby mode. In one embodiment, the first semiconductor device is capable of retaining associated information thereof in the second operation mode.

In one embodiment, the active layer only includes wells having the first conductivity type (i.e., N type, and the semiconductor devices having a second conductivity type of P type, out of the plurality semiconductor devices, each are formed in a well with the first conductivity type in the active layer.

In one embodiment, the first and second power supply lines are formed in different layers, for example, metal1 and metal3, respectively.

In an embodiment, as illustrated in FIG. 7, the method may further includes setting S611 a first bias supply element for supplying the first bias voltage to the first well, and setting S613 a second bias supply element for supplying the different second bias voltages to the second well.

In an embodiment, the two or more rows includes a third row, the wells having the first conductivity type further includes a third well disposed in the third row, the plurality of semiconductor devices further includes at least one third semiconductor device arranged in the third row, partly formed in the third well, and having a current terminal connected to an additional second power supply line for the third row. In the embodiment, the method may further include a step S615 of setting a third power supply line (407) for the third row, as illustrated in FIG. 8.

Further, the third well is powered with a third bias voltage in the first operation mode and powered down in the second operation mode, and the third power supply line is powered with a third power voltage in the first operation mode and powered down in the second operation mode.

In one embodiment, the method may further includes a step S609 of setting a third supply line (e.g., supply line 111) for each row, which can carry a fourth voltage (VSS), as illustrated in FIG. 6.

In one embodiment, the method may further includes setting a control section for control the supplying of the first and second bias voltages and the first and second power voltages to the logic cell to set the logic cell into the first operation state or the second operation state.

In an embodiment, all the semiconductor devices having a second conductivity type, which is different from the first conductivity type, are powered in the standby mode and formed in a second well, and all the semiconductor devices having the second conductivity type are powered in the standby mode are formed in a first well. In one embodiment, wells other than the first well are powered down in the second operation mode.

According to an embodiment of the present invention, routing density of the secondary power VDDC in the metal layer is reduced, and accordingly, die size can be reduced. According to another embodiment, separate N-Wells are provided in the logic cell, and electrically isolated, e.g., powered with different bias voltages, and thus the well leakage in the standby mode is reduced. According to a further embodiment, the well leakage and the devices powered with VDDC, that is, the devices of the VDDC domain are grouped, for example, formed in the first well 103, so that routing blocks can be reduced, the routing flexibility and routing areas can be enhanced, and/or die size can be reduced.

The embodiments of the present invention have been described above with reference to the accompanying drawings. However, it should be understood that these embodiments are merely illustrative and are not limitations for the claims of the application. The embodiments of the present invention can be freely combined without going beyond the scope of the present invention. Moreover, one of ordinary skill in the art can make various modifications to the embodiments and details of the present invention based on the teachings of the present invention, without departing from the scope of the present invention, and thus, all these modifications are intended to be embraced within the spirit and scope defined by the attached claims.

The invention claimed is:

1. A logic cell for an integrated circuit, wherein the logic cell is arranged in two or more rows, the logic cell comprising:
   an active layer including wells having a first conductivity type, said wells including a first well located in a first row and a second well located in a second, different row;
   a plurality of semiconductor devices formed in and on the active layer and arranged in the two or more rows, wherein the plurality of semiconductor devices includes at least one first semiconductor device formed partly in the first well and at least one second semiconductor device formed partly in the second well;
   a first power supply line only for the first row, wherein a current terminal of the first semiconductor device is coupled to the first power supply line; and
   a second power supply line for the second row, wherein a current terminal of the second semiconductor device is coupled to the second power supply line;
   wherein the first well is powered with a first bias voltage in a first operation mode and in a second, different operation mode, and the second well is powered with a second, different bias voltage in the first operation mode;
   wherein the first power supply line is powered with a first power voltage in both of the first and second operation modes; and
   wherein the second power supply line is powered with a second power voltage, which is different from the first power voltage, in the first operation mode, and powered down in the second operation mode.

2. The integrated circuit of claim 1, wherein the first operation mode is a normal operation mode, and the second operation mode is a standby mode, and wherein the first semiconductor device retains associated information thereof in the second operation mode.

3. The integrated circuit of claim 1,
   wherein the active layer only includes wells having the first conductivity type, wherein the first conductivity type is N type, and
   wherein semiconductor devices having a second, P type conductivity, out of the plurality semiconductor devices, are formed in a well with the first conductivity type in the active layer.

4. The integrated circuit of claim 3, wherein all the semiconductor devices having the second conductivity type that is different from the first conductivity type and powered down in the second operation mode are formed in the second well, and all the semiconductor devices having the second conductivity type and powered in the second operation mode are formed in the first well.

5. The integrated circuit of claim 1, wherein the first and second power supply lines are formed in different layers.

6. The integrated circuit of claim 5,
   wherein for the first row, the logic cell further comprises one interconnect with dielectric layers interposed between the interconnect, and a layer of the second power supply line and a layer of the first power supply line, and
   wherein the first power supply line is connected to the current terminal of the first semiconductor device by way of a part of the layer of the second power supply line, the interconnect, and a part of the layer of the first power supply line, and vias in the dielectric layers.

7. The integrated circuit of claim 1, further comprising:
   a first bias supply element for supplying the first bias voltage to the first well; and
   a second bias supply element for supplying the second bias voltage to the second well.

8. The integrated circuit of claim 1, wherein the logic cell further comprises:
   a third row;
   a third well having the first conductivity type and disposed in the third row;
   a third power supply line for the third row; and a third semiconductor device formed in the third row, partly formed in the third well, and having a current terminal connected to the third power supply line, wherein, the third well is powered with a third bias voltage in the first operation mode and powered down in the second operation mode, and the third power supply line is powered with a third power voltage in the first operation mode and powered down in the second operation mode.

9. The integrated circuit of claim 1, further comprising a third supply line for each row for carrying a fourth voltage.

10. The integrated circuit of claim 9, wherein the third supply line is shared by two adjacent ones of the rows.

11. The integrated circuit of claim 1, wherein the wells other than the first well are powered down in the second operation mode.

12. A standard cell for an integrated circuit, wherein the standard cell is arranged in two or more rows, the standard cell comprising:

an active layer including wells having a first conductivity type, including a first well located in a first row and a second well located in a second, different row;

a plurality of semiconductor devices formed in and on the active layer and arranged in the two or more rows, wherein the plurality of semiconductor devices includes at least one first semiconductor device formed partly in the first well and at least one second semiconductor device formed partly in the second well;

a first power supply line only for the first row, wherein a current terminal of the first semiconductor device is coupled to the first power supply line; and a second power supply line for at least the second row, wherein a current terminal of the second semiconductor device is coupled to the second power supply line;

wherein the first well is powered with a first bias voltage in a first operation mode and in a second, different operation mode, and the second well is powered with a second, different bias voltage in the first operation mode;

wherein the first power supply line is powered with a first power voltage in both of the first and second operation modes; and wherein the second power supply line is powered with a second power voltage, which is different from the first power voltage, in the first operation mode, and powered down in the second operation mode.

* * * * *